United States Patent
Arunachalam et al.

(10) Patent No.: US 6,442,745 B1
(45) Date of Patent: Aug. 27, 2002

(54) METHOD AND APPARATUS FOR LAYOUT-CONSTRAINED GLOBAL ROUTING

(75) Inventors: Prakash S. Arunachalam, Portland, OR (US); Heming Chan, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/474,712

(22) Filed: Dec. 29, 1999

(51) Int. Cl.$^7$ .............................................. G06F 17/50
(52) U.S. Cl. .............................. 716/13; 716/12; 716/11
(58) Field of Search .............................. 716/13, 14, 12, 716/7, 8, 9, 10

(56) References Cited

U.S. PATENT DOCUMENTS

| | | | | |
|---|---|---|---|---|
| 4,613,941 A | * | 9/1986 | Smith et al. | 716/12 |
| 5,604,680 A | * | 2/1997 | Bamji et al. | 364/491 |
| 5,629,860 A | * | 5/1997 | Jones et al. | 364/490 |
| 5,856,927 A | * | 1/1999 | Greidinger et al. | 364/491 |
| 6,145,117 A | * | 11/2000 | Eng | 716/18 |
| 6,230,304 B1 | * | 5/2001 | Groeneveld et al. | 716/7 |

OTHER PUBLICATIONS

Cormen, T.H., et al., "Introduction to Algorithms", *MIT Press, McGraw–Hill Book Company*, 504–513, (1990).

Hadlock, F.O., "A Shortest Path Algorithm for Grid Graphs", *Networks, An International Journal*, vol. 7, 323–334, (1977).

Lee, C.Y., "An Algorithm for Path Connections and Its Applications", *IRE Transactions on Electronic Computers*, vol. EC–10, 346–365, (Sep. 1961).

Ousterhout, J.K., et al., "Magic: A VLSI Layout System", *Proceedings ACM IEEE 21st Design Automation Conference*, Albuquerque, New Mexico, 152–159, (Jun. 1984).

Pearl, J., "Heuristics: Intelligent Search Strategies for Computer Problem Solving", *Addison–Wesley Publishing Company*, 74–80, (1984).

Rivest, R.L., et al., "A "Greedy" Channel Router", *ACM IEEE 19th Design Automation Conference Proceedings*, Las Vegas, Nevada, 418–424, (Jun. 1982).

Sherwani, N.A., "Algorithms for VLSI Physical Design Automation", *3rd Edition, Kluwer Academic Publishers*, 215–223, (1999).

Soukup, J., "Fast Maze Router", *Proceedings Design Automation Conference, IEEE Catalog No. 78*, Las Vegas, Nevada, 100–102, (Jun. 1978).

Soukup, J., "Global Router", *16th Design Automation Conference Proceedings*, San Diego, California, 481–484, (Jun. 1979).

* cited by examiner

*Primary Examiner*—Vuthe Siek
(74) *Attorney, Agent, or Firm*—Schwegman, Lundberg, Woessner & Kluth, P.A.

(57) ABSTRACT

A global router uses an algorithm for controlling routing based upon rough topologies. In one embodiment a set of regions and layers is specified over which the routing must occur. Tunnels can be defined outside of which routing cannot occur. Topologies of previous iterations are considered. Restrictions on the amount of deviation between successive iterations can be specified. As a result, successive iterations of the global router do not cause large changes in the timing delays of circuits. In addition, partial tunnels can be stretched to accommodate nearby nets. Also described are an integrated circuit that is produced using the layout-constrained global routing algorithm and a computer-readable medium storing computer-executable instructions and at least one data structure for implementing the algorithm.

30 Claims, 8 Drawing Sheets

250 — Tunnel: <tunnel i.d.>
252 — Style: <style>
254 — Nets:
    256 — <net 1 i.d.>
    258 — <net 2 i.d.>
    .
    .
    .
    <net N i.d.>
260 — EndNets
262 — Segments:
264 — (TunnelSegment1Geometry <X1> <Y1> <X2> <Y2> <H or V> <layers>)
266 — (TunnelSegment2Geometry <X3> <Y3> <X4> <Y4> <H or V> <layers>)
    .
    .
    .
    (TunnelSegmentNGeometry <Xi> <Yi> <Xj> <Yj> <H or V> <layers>)
268 — EndSegments
270 — EndTunnel

*Fig. 7*

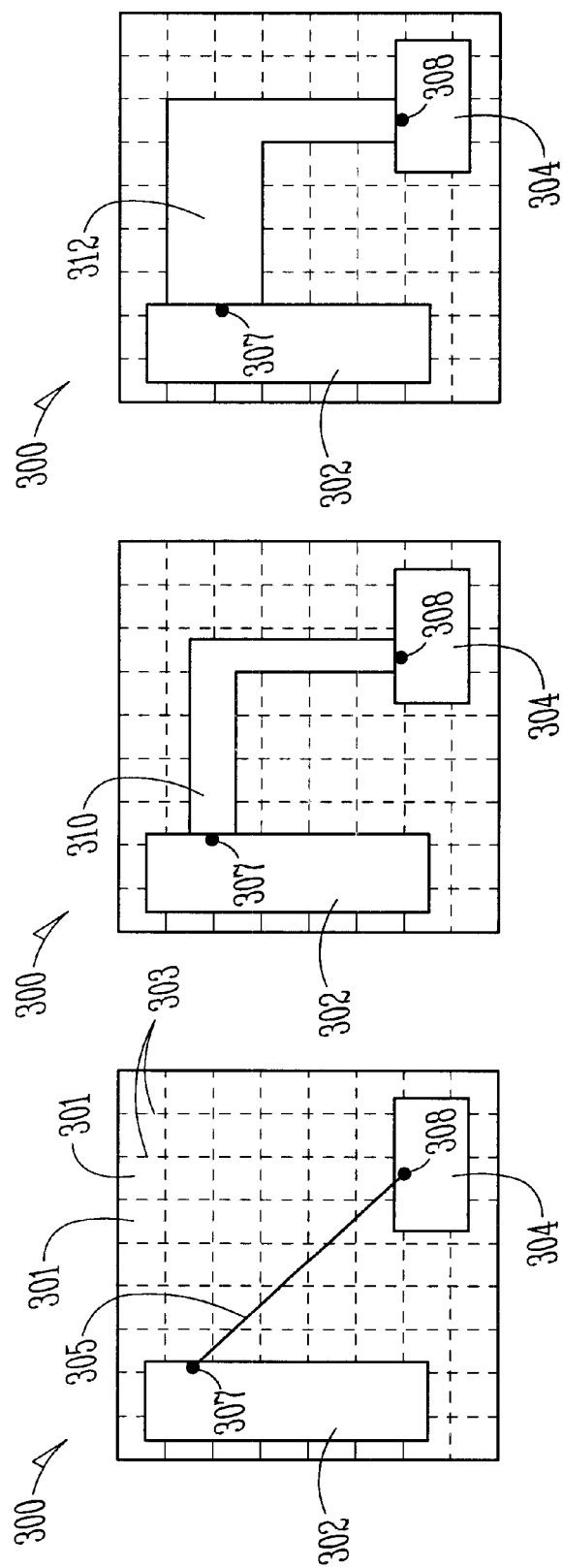

METHOD AND APPARATUS FOR LAYOUT-CONSTRAINED GLOBAL ROUTING

TECHNICAL FIELD OF THE INVENTION

The invention relates to the design and layout of integrated circuits and, in particular, to methods and apparatus for constraining global routing of an integrated circuit layout.

BACKGROUND OF THE INVENTION

In the field of integrated circuit (IC) development, there is an ever-increasing demand for IC layout tools that are faster, more efficient, and more reliable than their predecessors. This is because there is an ever-accelerating focus upon shortening IC development cycles and time to market, reducing IC development and manufacturing costs, and increasing IC product reliability.

As is well known to IC developers, a process known as "global routing" can be used to route the interconnections (also called "nets") between terminals on an IC. Global routing uses a divide-and-conquer approach, wherein an IC layout is divided into a rectilinear grid of global routing cells (also called "artificial regions" or "ARs"), and the router plans global routes for the nets in a rectilinear fashion using the cells. Within the global routing cells, detailed routing of nets is generated based upon the global routes.

Global routers often require successive iterations of the routing process until the layout meets a desired set of design specifications. While global routing achieves high density, it often provides poor controllability. Successive iterations of global routing with small changes to the layout may result in large changes to the routing. This is undesirable, because it can result in a failure to achieve timing convergence of the routing. Because the circuit interconnect contributes significantly to timing delays in the IC circuits, the changes in topology can lead to large changes in the timing delays of circuits. Thus, in order to achieve timing convergence of routing, successive iterations should not cause large changes in the timing delays of circuits.

For the reasons stated above, there is a substantial need in the area of IC layout to provide a global routing system and methods that do not cause large changes in the timing delays of circuits on successive iterations.

In addition, there is a substantial need to provide an IC having a layout that has been generated by a system and methods that do not cause large changes in the timing delays of the IC's circuits on successive iterations.

SUMMARY OF THE INVENTION

Accordingly, in one embodiment of the invention there is provided a method adapted to be used in a data processing system. The method includes defining a set of constraints for global routing of an integrated circuit layout. The set of constraints comprises at least one topological constraint. The method also includes performing global routing in accordance with the set of constraints.

In another embodiment, there is provided a data processing system comprising a processor and a memory. The processor executes a computer program stored in the memory. The computer program includes the operation of accessing from the memory a set of constraints for global routing of an integrated circuit layout. The set of constraints comprises at least one topological constraint. The computer program also includes the operation of performing global routing in accordance with the set of constraints.

In a further embodiment, there is provided an integrated circuit having a layout generated by a process which comprises defining a set of constraints for global routing of the integrated circuit layout. The set of constraints comprises at least one topological constraint. The process further includes performing global routing in accordance with the set of constraints.

Additional embodiments are described and claimed.

BRIEF DESCRIPTION OF THE DRAWINGS

FIG. 7 illustrates an example of a data structure for defining a tunnel used in a global router, in accordance with one embodiment of the invention;

FIGS. 8–10 illustrate schematics that demonstrate the creation and snapping of tunnels within a global router, in accordance with one embodiment of the invention.

DETAILED DESCRIPTION OF THE INVENTION

In the following detailed description, reference is made to the accompanying drawings which form a part hereof, and in which is shown by way of illustration specific embodiments in which the invention may be practiced. Other embodiments may be utilized and structural changes may be made without departing from the scope of the invention.

Figure 1:
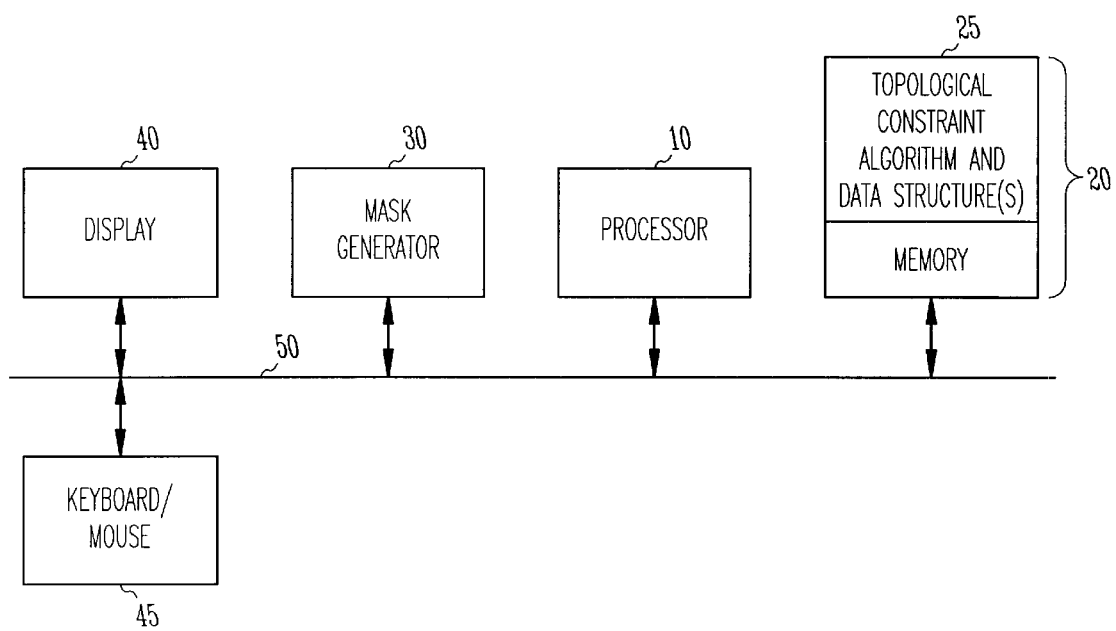
FIG. 1 illustrates a block diagram of a data processing system with which one embodiment of the invention can be implemented.

FIG. 1 illustrates a block diagram of a data processing system with which one embodiment of the invention can be implemented. The data processing system shown in FIG. 1 is capable of performing IC layout processing, including global routing. In one embodiment, the system comprises a processor 10, memory 20, mask generator 30, display monitor or computer screen 40, and keyboard/mouse 45, all of which are coupled to a system bus 50. Pointing devices other than a mouse can be used.

Memory 20 can comprise any suitable memory storage devices and in one embodiment includes main memory implemented with random access memory (RAM) chips, read only memory, one or more hard drives, and removable media such as magnetic or optical disks. Main memory 20 can be implemented in any suitable commercially available memory system.

Other user interface elements and peripheral devices can also form a part of the data processing system, but they have been omitted from FIG. 1, because it is known in the art how to utilize them in IC design and layout systems of the type in which the present invention can be employed.

While system 50 and the busses coupled to it are shown as single lines in FIG. 1, they ordinarily will be implemented as multiple conductors. Alternatively they can be implemented in any other suitable transmission medium, such as wireless or fiber optic technology.

In one embodiment the computer software and associated data structure(s) for implementing the topological-constrained global routing algorithms of the invention reside in a portion 25 of memory 20 and are executed by processor 10. When the global routing process has been completely executed by processor 10, the global routing data structure is used in conjunction with mask generator 30 to generate a mask set for the target IC, in a well known manner.

The term "computer-readable medium", as used herein, means any device, whether active or passive, containing computer instructions for instructing a processor, and/or containing computer data, such as a hard disk, floppy disk, compact disk (CD), random access memory (RAM), read only memory (ROM), cache memory, or the like.

The global routing computer software can also be implemented by a different type of software module that can reside somewhere other than as described above and be executed by an execution unit (not shown) different from main processor 10.

Figure 2:
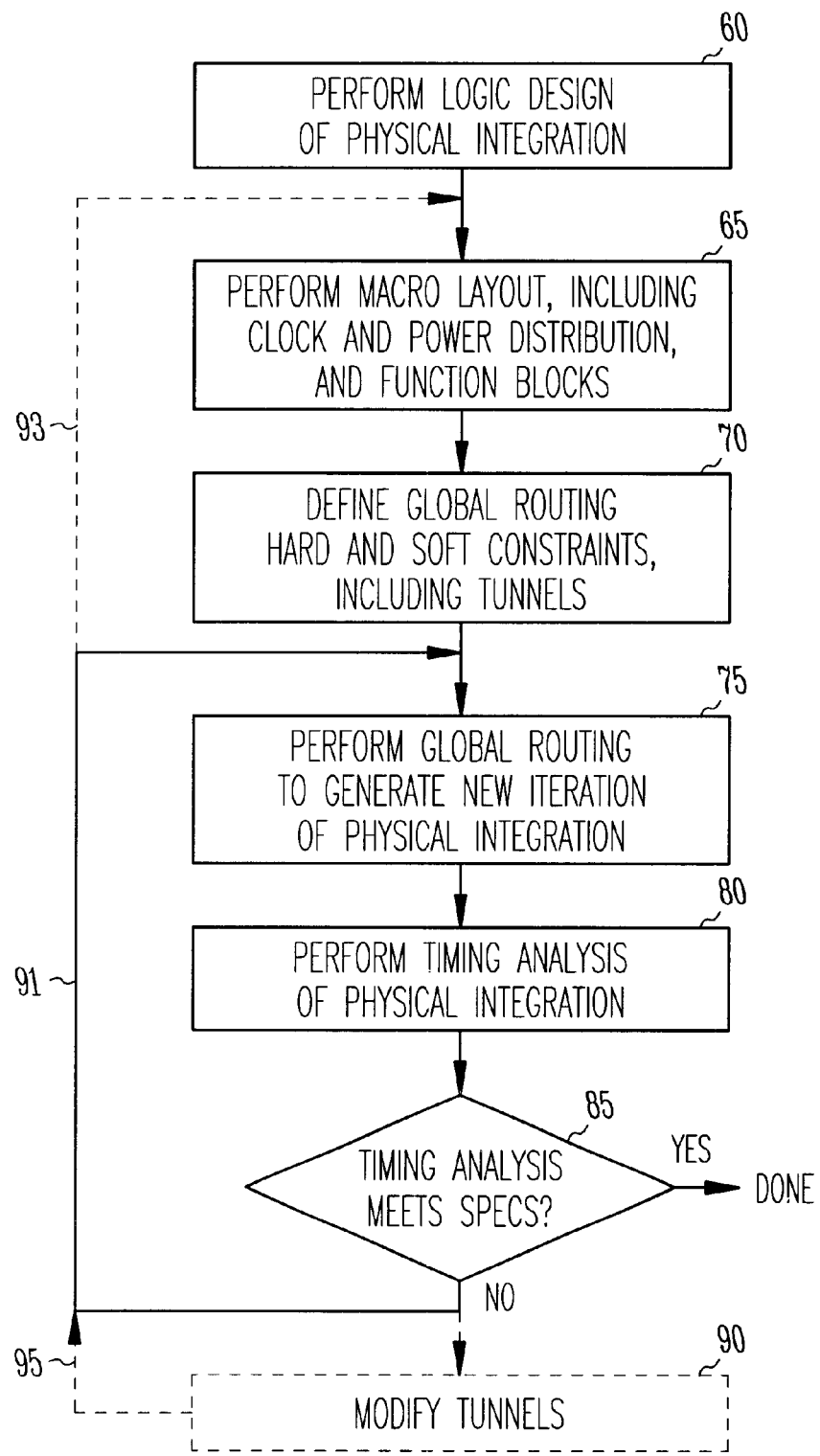
FIG. 2 illustrates a simplified flow diagram of a method of performing IC design and layout with a global router that uses tunnels, in accordance with one embodiment of the invention.

FIG. 2 illustrates a simplified flow diagram of a method of performing IC design and layout with a global router that uses tunnels, in accordance with one embodiment of the invention. Tunnels, as implemented by one embodiment of the invention, represent a versatile tool by which global routing can be controlled, so that successive global routing iterations do not differ significantly. By controlling and constraining routing routes to certain defined topological regions, significantly smaller deviations in global routing occur between successive iterations. Tunnels will be explained in greater detail below, but first an overview of a global routing process, according to one embodiment of the invention, will be presented.

With reference to block 60, a first stage in IC development is to perform the logic design of the "physical integration" of the IC. "Physical integration" is used herein to mean the process of reducing an IC design specification to a physical sample IC and includes the stages of logic design, circuit design, circuit layout, timing analysis, mask generation, IC manufacture, and IC testing. To develop a very large scale integration (VLSI) circuit, it is not uncommon to go through several physical integrations, each requiring multiple iterations within one or more stages.

After the logic design 60 is complete, the IC developers perform a macro-level layout of the IC, which includes specifying the location of clock and power distribution systems, and the location of all functional blocks (e.g. registers, arithmetic logic units, cache memories, input/output, random logic, read-only memory, random access memory, and so forth).

Next in block 70 the global routing of nets between internal terminals of the IC is defined in terms of "hard constraints" and "soft constraints". Hard constraints include the location of functional blocks; i.e. the global router cannot route nets through functional blocks. Soft constraints include specifying that certain layers of the IC can or cannot be used; minimizing the projected costs to manufacture, expressed in terms of cost per micron per layer and cost per via; and limiting the number or percentage of routing changes since the previous routing iteration.

In general a global router tries to find the route of least cost between any two terminals. Many different routing paths are possible except to the extent that such paths are constrained by any of the constraints mentioned above. When AR edges are closed or "opaque" to the router, the router cannot go in that direction and has to find another route.

Another soft constraint, as introduced by the present invention, are tunnels. Tunnels are a way for the circuit designer to constrain the global routing system to generate routes through certain desired topological regions or to avoid placing routes through other topological regions. Tunnels can be specified in terms of physical dimensions including length and width, layers, and location of groupings of contiguous ARs on the layout grid. Tunnel location can be specified in two or three dimensions. Tunnels can also be specified to extend inside of blocks. Tunnels are described in greater detail below.

Next in block 75 global routing is performed by the global routing system, and a new iteration of the physical integration is generated. Each iteration comprises a large database of information that precisely describes the dimensions of every block, terminal, and net of the IC.

Next in block 80 a timing analysis of the physical integration is performed using well known circuit analytical tools, and in block 85 a determination is made whether the timing parameters of this physical integration meet the design specifications. If so, the global routing phase of this physical integration is complete. If not, the process returns to block 75 via path 91, where another global routing iteration is performed. Successive global routing iterations are carried out until either this physical integration meets the timing requirements (i.e. timing convergence has been achieved) or it is necessary to return to block 65 via dashed path 93 and change the macro layout of the IC. Alternatively, either singly or in conjunction with either of the return paths 91 and 93 previously described, it may become necessary to modify the tunnel specifications, as shown by dashed block 90 and dashed path 95, to achieve a global routing of the IC that meets the design specification timing requirements.

Figure 3:
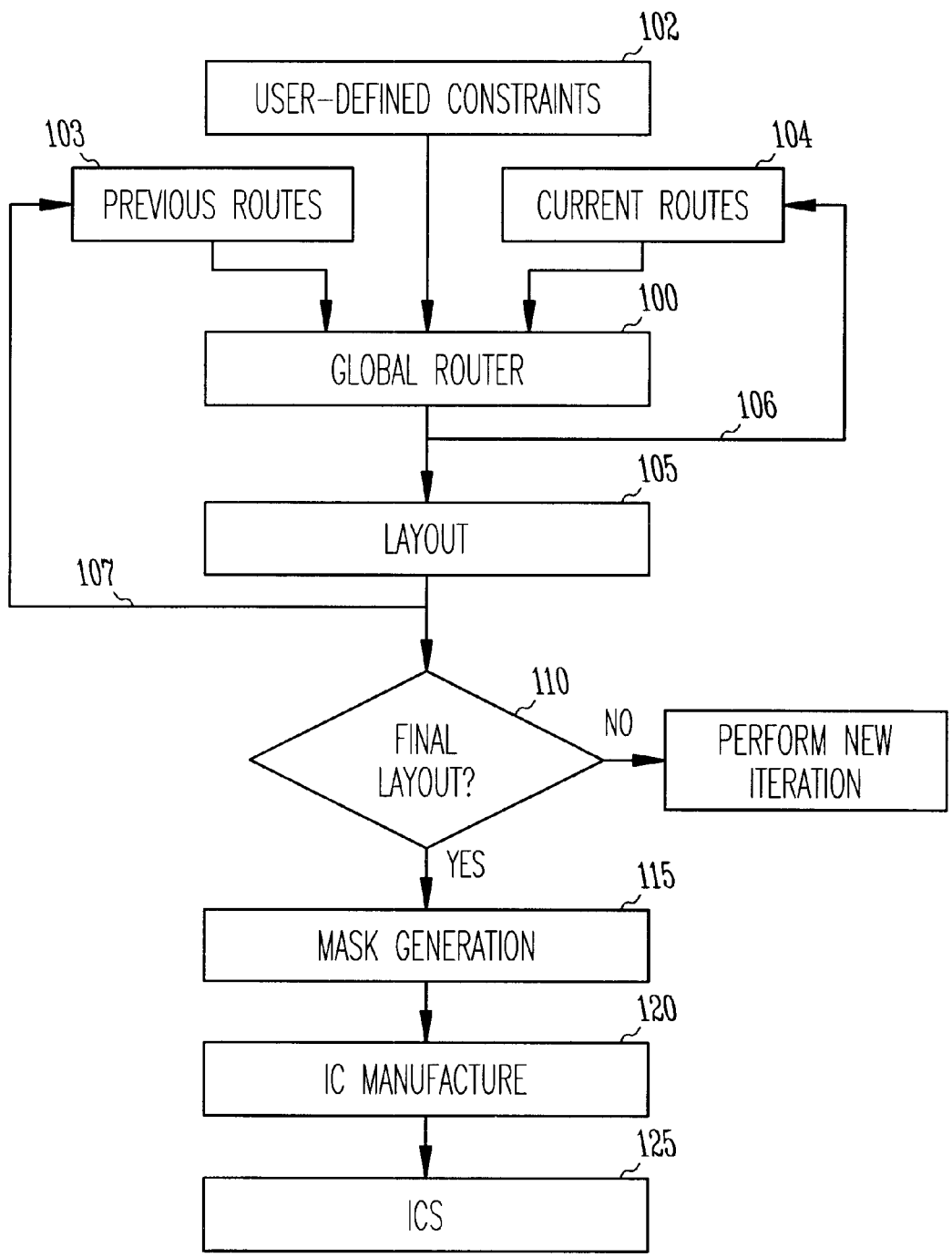
FIG. 3 illustrates a simplified flow diagram showing the operation of a global router, as well as primary post-layout operations in the production of ICs, in accordance with one embodiment of the invention.

FIG. 3 illustrates a simplified flow diagram showing the operation of a global router 100, as well as primary post-layout operations in the production of ICs, in accordance with one embodiment of the invention. As represented by block 102, various user-defined constraints can be input into global router 100. These include both hard constraints and soft constraints, as mentioned earlier. In addition, global router 100 accepts constraints from global routes generated from the previous iteration, as indicated by pathway 107 feeding block 103. Further, global router 100 accepts constraints from global routes which it has generated during the current iteration, as indicated by pathway 106 feeding block 10.

From the input constraints, global router 100 generates a layout (block 105). If the layout meets all of the requirements of the design specification, including the timing requirements, this will be the final layout (block 110); otherwise a new iteration of global routing is performed. In the new global routing iteration, the density improvements of the previous routing(s) are maintained. Moreover, the global routing generated by the new iteration will not contain a significantly large number of changes over the current iteration, so that significantly improved routing controllability and timing convergence can be achieved.

After final layout has been achieved, masks are generated (block 115) and used to fabricate ICs (blocks 120, 125).

Figure 4:
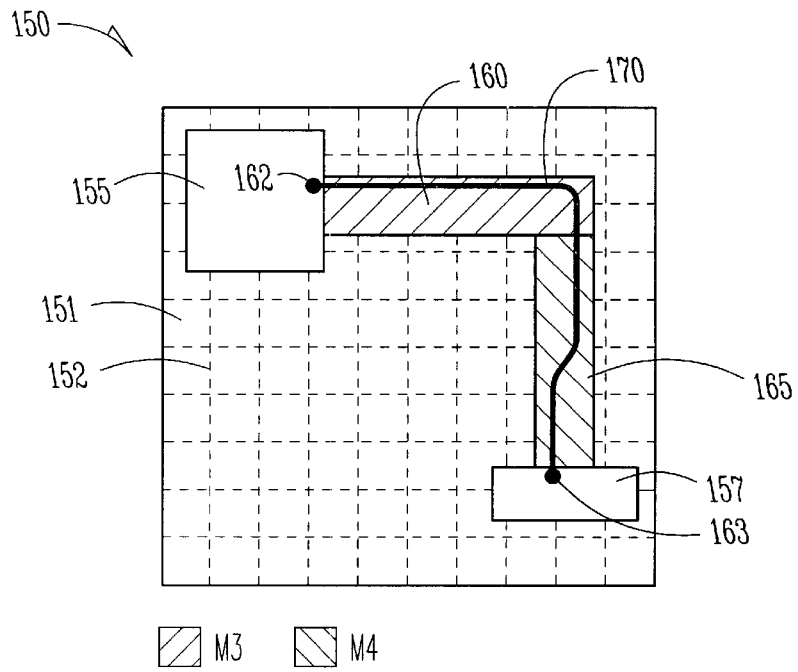
FIG. 4 illustrates an example of two tunnels used to constrain global routing, in accordance with one embodiment of the invention.

FIG. 4 illustrates an example of two tunnels 160, 165 used to constrain global routing, in accordance with one embodiment of the invention. A layout grid 150 comprises a plurality of cells or artificial regions (ARs) 151 whose internal boundaries are indicated by dashed lines 152. Logic blocks 155 and 157, whose physical dimensions and locations represent hard constraints imposed upon the global router, are coupled by two tunnels 160, 165. In this particular example, tunnel 160 has been defined to be in metal layer M3, while tunnel 165 has been defined to be in metal layer M4. However, it will be apparent to one of ordinary skill in the art that tunnels can be defined to be within any one or more layers of the IC layout. Net 170 has been routed through tunnels 160 and 165 to couple respective terminals 162 and 163 on blocks 155 and 157. Depending upon the user-defined tunnel specifications, other nets (not illustrated) can also be routed through tunnels 160 and 165.

Figure 5:
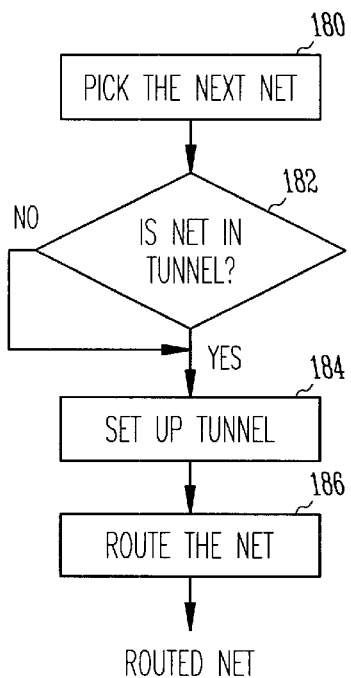
FIG. 5 illustrates a simplified flow diagram showing the operation of a global router which uses tunnels, in accordance with one embodiment of the invention.

FIG. 5 illustrates a simplified flow diagram showing the operation of a global router which uses tunnels, in accordance with one embodiment of the invention. The flow diagram of FIG. 5 is used for each net in the layout. It is assumed that the layout designer has previously defined tunnels for those nets that must be constrained within the layout. It is up to the layout designer to chose which nets should be constrained by topological constraints such as tunnels.

In block 180 the router picks the next net. A determination is made in decision block 182 whether the net is in a tunnel. If so, the process goes to block 184, where the tunnel is set up. The router goes through a database of all AR edges and checks to see which edges define a tunnel constraint for this particular net. If, in decision block 182, the net is not in a tunnel, the process goes directly to block 186. In block 186 the router routes the net while staying within the AR edges overlapping the tunnel. This process is repeated for each net in the layout until all nets have been routed, or until the process otherwise terminates, e.g. for an inability to route further for some reason, such as the constraints being too tightly defined.

Figure 6:
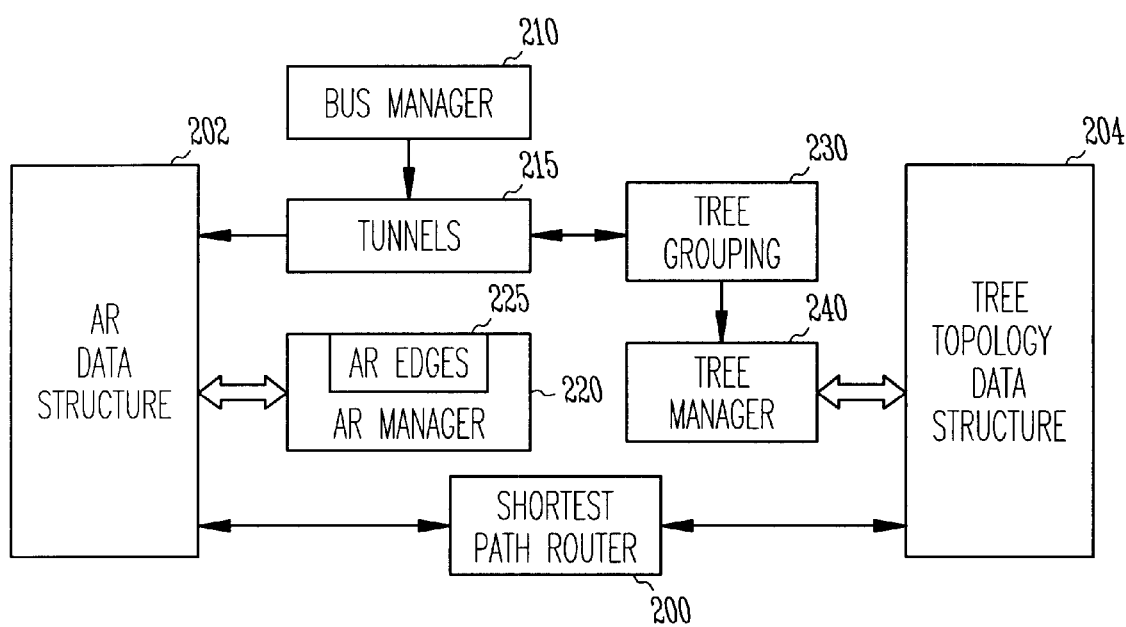
FIG. 6 illustrates a block diagram of a global router which uses tunnels, in accordance with one embodiment of the invention.

FIG. 6 illustrates a block diagram of a global router which uses tunnels, in accordance with one embodiment of the invention. As mentioned above, the global router is implemented using computer software and computer data structures residing in or on a computer-readable medium, the significant portions of which will now be described.

AR data structure 202 comprises a database of artificial regions (ARs). AR manager 220 is coupled to AR data structure 202 and manages it. AR manager 220 also manages a local list of AR edges 225.

Tree topology data structure 204 comprises a database of trees. Trees are groupings of nets. Tree topology data structure 204 includes all information supporting the global routing. More specifically, tree topology data structure 204 includes information, for example, concerning how one or more groups of trees are routed inside a tunnel.

Tree manager 240 is coupled to tree topology data structure 204. Tree manager 240 manages all of the nets and all of their associated information including their topology. Tree manager 240 is also coupled to tree grouping block 230, which is a database of tree groupings.

Bus manager 210 is coupled to and manages a database of tunnels 215. Tunnels database 215 is coupled to AR data structure 202. Tunnels database 215 is also coupled to tree grouping database 230.

Shortest path (SP) router 200 is coupled to both the AR data structure 202 and the tree topology data structure 204. SP router 200 determines the shortest path between two terminals, taking into consideration the available ARs and other topological constraints.

FIG. 7 illustrates an example of a data structure for defining a tunnel used in a global router, in accordance with one embodiment of the invention. For example, the tunnel data structure shown in FIG. 7 can be maintained in the tunnel database 215 shown in FIG. 6.

The tunnel data structure shown in FIG. 7 represents one embodiment of how tunnel information can be stored in a global routing system that uses tunnels. Other tunnel data structures will be apparent to those of ordinary skill in the art.

The "tunnel i.d." field 250 uniquely identifies the particular tunnel.

The "style" field 252 identifies the type of constraint desired for the particular, e.g. "hard" or "soft".

The "nets" field 254 comprises a list of nets which this particular tunnel is desired to constrain, e.g. an item 256 for a net identified as "net 1 i.d." and an item 258 for a net identified as "net 2 i.d.".

The "EndNets" field 260 identifies the end of the "nets" list.

The "Segments" field 262 comprises a list of tunnel segments and their associated geometric parameters, e.g. an item 264 for a tunnel segment identified as "TunnelSegment1" and an item 266 for a tunnel segment identified as "TunnelSegment2", each with geometric parameters which can be specified in any suitable manner. In one embodiment, geometric parameters include a first coordinate identified by X1, Y1; a second coordinate identified by X2, Y2; a parameter specifying horizontal (H) or vertical (V) orientation; and one or more parameters specifying applicable layers. Any number of layers can be specified. In another embodiment, the geometric parameters include one X,Y coordinate at the center of the tunnel segment, a tunnel segment width, a tunnel segment length, a parameter specifying horizontal or vertical orientation, and one or more parameters specifying applicable layers. A "tunnel segment" is any defined portion of a given tunnel. For example, with reference to FIG. 4, the tunnel coupling blocks 155 and 157 comprises tunnel segments 160 and 165. While tunnel segments 160 and 165 are illustrated as rectangular in shape, they could be any suitable shape, such as squares, trapezoids, rhomboids, triangles, ellipsoids, or any other shape.

The "EndSegments" field 268 identifies the end of the "tunnel segments" list.

The "EndTunnel" field 270 identifies the end of the tunnel.

FIGS. 8–10 illustrate schematics that demonstrate the creating and snapping of tunnels within a global router, in accordance with one embodiment of the invention.

Referring first to FIG. 8, a layout grid 300 comprises a plurality of cells or artificial regions (ARs) 301 whose internal boundaries are indicated by dashed lines 303. Logic blocks 302 and 304, whose physical dimensions and locations represent hard constraints imposed upon the global router, have respective terminals 307 and 308. The shortest path routing without any constraints is represented by flyline 305 which connects terminals 307 and 308 in a straight line.

Referring to FIG. 9, a tunnel 310 has been defined to connect terminals 307 and 308 and to use one or more metal layers. Tunnel 310, when originally created, couples terminals 307 and 308 in a rectilinear manner, i.e. using rectangular regions that conform to the grid pattern of ARs. However, tunnel 310 may overlap AR edges and may not use the entire area of the ARs it traverses.

Referring to FIG. 10, tunnel 310 has "snapped to" the ARs that it traverses, so that it now stays within the AR edges and uses the entire area of the ARs that it traverses. It will be understood, however, that many different design rule methodologies can be utilized in the creation and utilization of tunnels. For example, tunnels can be created and used without snapping to ARs. Or they can be made to snap to fractional portions of ARs such as half-ARs. The relationship between tunnel size and position and the ARs is arbitrary and a matter of design choice.

As viewed in the embodiments illustrated in FIGS. 4 and 8–10, the topological constraint mechanism, implemented for example using a tunnel algorithm, is used to couple terminals that lie within ARs that are overlapped by a tunnel. The tunnel allows routing within the ARs that it overlaps and allows routing across AR edges in the layers in which the tunnel segments are defined. However, it is desirable that tunnels be able to be used to connect terminals or pins which do not lie within ARs that are overlapped by a tunnel. One reason is that over the course of successive physical integration iterations, the position of blocks can change, due to block relocation, block growth, etc., thereby changing the position of their pins and ports, so that the blocks' terminals can be moved outside of tunnels in which they previously lay. To avoid requiring the layout designer to redefine the tunnel locations after each iteration, the invention provides for "stretching" of "partial tunnels", which will now be described with reference to FIGS. 11–14.

FIGS. 11–14 illustrate schematics that demonstrate the stretching of partial tunnels within a global router, in accordance with one embodiment of the invention.

The tunnel "stretching" mechanism adds to the original tunnel concept the concept of a Steiner tree to generate the topology of the complete net and thus "grow" a partial tunnel to encompass the complete net.

Figure 11:
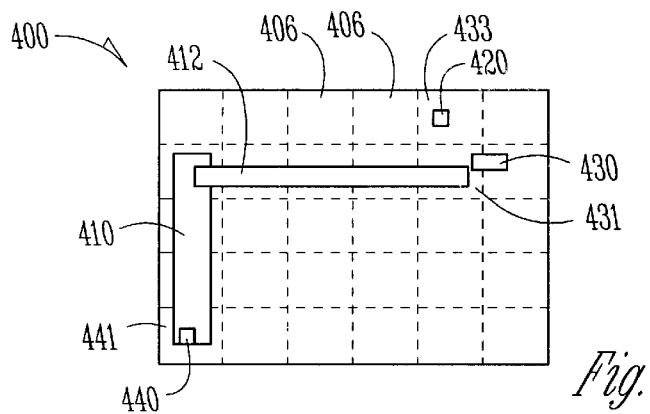
FIGS. 11–14 illustrate schematics that demonstrate the stretching of partial tunnels within a global router, in accordance with one embodiment of the invention.

Referring first to FIG. 11, a layout grid 400 comprises a plurality of cells or artificial regions (ARs) 406. Grid 400 comprises three terminals 420, 430, and 440, and it is desired to connect these three terminals with one net. A tunnel comprises tunnel segments 410 and 412. Tunnel segment 410 overlaps terminal 440, whereas tunnel segment 412 extends substantially to terminal 430 but doesn't touch it.

Terminals 430 and 440 are inside ARs that the tunnel overlaps, namely ARs 431 and 441, respectively. Terminal 440 is already covered by the tunnel. And since terminal 430 lies within AR 431 that the tunnel overlaps, no tunnel growth is required to route a net to terminal 430. However, terminal 420 lies outside ARs that the tunnel overlaps, so that a tunnel segment needs to be grown to link it.

In one embodiment of the invention, a Steiner tree is used to check whether a tunnel requires growth. If any of the terminals is outside the tunnel, the tunnel requires growth. A Steiner tree is a tree that connects a set of two-dimensional points in a rectilinear fashion. The Steiner tree can be defined to connect all input points meeting the following criteria: the end points of the tunnel segments are in the set of points; the end points of the tunnel segments are part of the pre-connected array; and the terminals that are included in the set of points are outside the ARs overlapping the tunnel, and they are not part of a pre-route with any terminal that overlaps an AR inside the tunnel.

Figure 12:
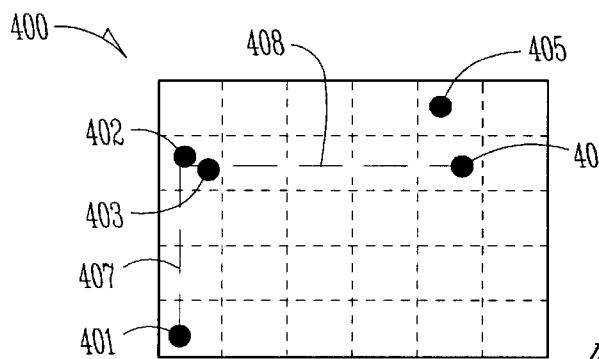

Referring now to FIG. 12, the layout grid 400 comprises five points, of which points 401, 402, 403, and 404 belong to a pre-connected array that is represented by dashed lines 407 and 408, and point 405 doesn't belong to the array. The Steiner tree generates the AR edges for the set of points.

Figure 13:
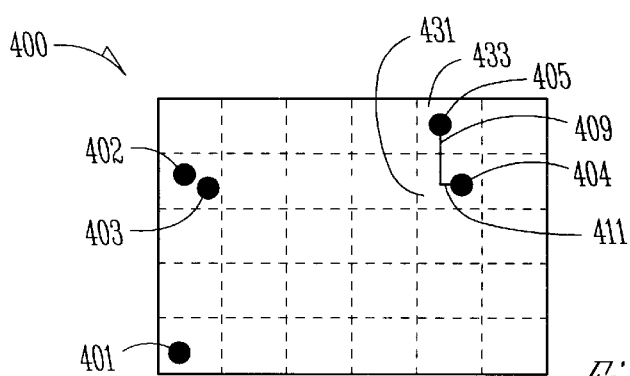

Referring now to FIG. 13, the Steiner tree connects points 404 and 405. All of the Steiner edges with at least one end outside the tunnel need to be added as tunnel segments. In FIG. 13 there are two edges. One Steiner edge, represented by 409, is connected to point 405, and one Steiner edge, represented by 411, is connected to point 404. The Steiner edge 411 connected to point 404 has both ends inside an AR 431 covered by the tunnel, so it is ignored. The Steiner edge 409 connected to point 405 has one end that is inside AR 433 which is not covered by the tunnel. Thus a tunnel segment of minimum width that is open to all layers is created and added to the original tunnel.

Figure 14:
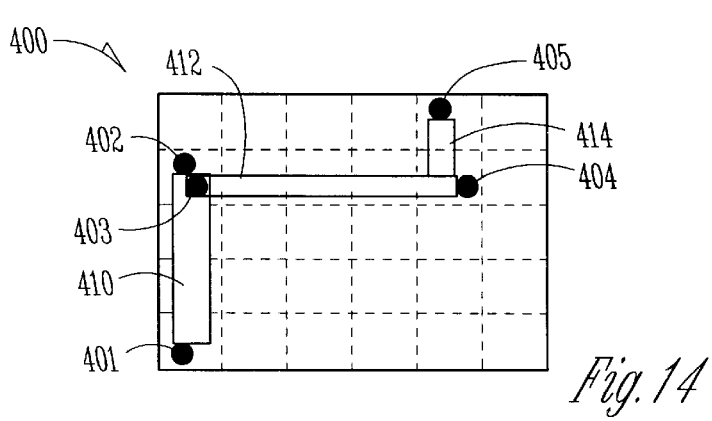

FIG. 14 shows the tunnel after growth. The tunnel comprises original tunnel segments 410 and 412, and new tunnel segment 414. Now all of the terminals 401, 402, 403, 404, and 405 of the net are inside the tunnel and can be routed.

The following is pseudo-code for an algorithm for deciding the need for tunnel growth for a net.
(1) for each terminal of net {
(2) if terminal does not overlap ARs containing tunnel
(3) tunnel growth is required;
(4) }

A Steiner tree is one suitable mechanism that can be used to stretch the tunnel to overlap the terminals. This mechanism should preferably be an optimal solution, so that it minimizes the total area of the new tunnel segment. Other suitable algorithms that can be adapted to stretch a tunnel are those of Kruskal and Prim, which can be found in Chapter 24, "Minimum Spanning Trees", *Introduction to Algorithms*, Thomas H. Cormen, Charles E. Leiserson, and Ronald L. Rivest, The MIT Press, McGraw-Hill Book Co., 1990, pp. 504–513.

CONCLUSION

In conclusion, the invention presents an effective method and apparatus for constraining and controlling global routing in a global routing system for performing IC layout. It contributes to a significant reduction in layout time by enabling timing convergence. It also takes previous iterations into account. And it enables the layout designer to specify the amount of deviation permitted between successive routing iterations. As a result, VLSI circuits can be developed and brought to market faster and at less cost.

The disclosed invention can be modified in numerous ways and can assume many embodiments other than those specifically set out and described above. For example, the invention can be used to route interconnections in any type of IC, such as a processor or other type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor, an application-specific integrated circuit (ASIC), a communications circuit, an artificial intelligence circuit, neural network, memory circuit, or any other type of circuit, or combination thereof.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A method for use in a data processing system and comprising:
   defining a set of constraints for global routing of an integrated circuit layout, wherein the global routing is to couple at least two terminals with a net, the set of constraints comprising at least one tunnel extending substantially only between the at least two terminals; and
   performing global routing in accordance with the set of constraints.

2. The method recited in claim 1 wherein the at least one tunnel comprises a predetermined grouping of artificial regions.

3. The method recited in claim 2 wherein the at least one tunnel comprises an area of contiguous artificial regions.

4. The method recited in claim 3 and further comprising:
   snapping the at least one tunnel to the contiguous artificial regions.

5. The method recited in claim 3 and further comprising:
   stretching the at least one tunnel to include at least one terminal that is outside the area of contiguous artificial regions.

6. The method recited in claim 5 wherein the operations are performed in the order recited.

7. The method recited in claim 1 wherein defining comprises defining one or more physical dimensions of the at least one tunnel.

8. The method recited in claim 1 wherein defining comprises defining one or more integrated circuit layers of the at least one tunnel.

9. The method recited in claim 1 wherein the at least one tunnel is defined by one or more from the group consisting of a tunnel identifier, a tunnel style, a list of nets constrained by the at least one tunnel, and a list of tunnel segments.

10. A data processing system comprising a processor and a memory, the processor executing a computer program stored in the memory and comprising the operations of:
    accessing from the memory a set of constraints for global routing of an integrated circuit layout, wherein the global routing is to couple at least two terminals with a net, the set of constraints comprising at least one tunnel extending substantially only between the at least two terminals; and
    performing global routing in accordance with the set of constraints.

11. The data processing system in claim 10 wherein the at least one tunnel comprises a predetermined grouping of artificial regions.

12. The data processing system recited in claim 11 wherein the at least one tunnel comprises an area of contiguous artificial regions, the area having a dimension that is less than a dimension of the integrated circuit layout.

13. The data processing system recited in claim 12 and further comprising:
    snapping the at least one tunnel to the contiguous artificial regions.

14. The data processing system recited in claim 12 wherein the computer program further comprises the operation of:
    stretching the at least one tunnel to include at least one terminal that is outside the area of contiguous artificial regions.

15. The data processing system recited in claim 10 wherein the set of constraints comprises one or more physical dimensions of the at least one tunnel.

16. The data processing system recited in claim 10 wherein the set of constraints comprises one or more integrated circuit layers of the at least one tunnel.

17. The data processing system recited in claim 10 wherein the at least one tunnel is defined by one or more from the group consisting of a tunnel identifier, a tunnel style, a list of nets constrained by the at least one tunnel, and a list of tunnel segments.

18. A computer-readable medium containing computer-executable instructions for instructing a processor to perform a method of global routing of an integrated circuit layout, the instructions comprising:
    defining a set of constraints for global routing of an integrated circuit layout, wherein the global routing is to couple at least two terminals with a net, the set of constraints comprising at least one tunnel extending substantially only between the at least two terminals; and
    performing global routing in accordance with the set of constraints.

19. The computer-readable medium recited in claim 18 wherein the at least one tunnel comprises a predetermined grouping of artificial regions.

20. The computer-readable medium recited in claim 19 wherein the at least one tunnel comprises an area of contiguous artificial regions.

21. The computer-readable medium recited in claim 20 and further comprising:
    snapping the at least one tunnel to the contiguous artificial regions.

22. The computer-readable medium recited in claim 20 and further comprising:
    stretching the at least one tunnel to include at least one terminal that is outside the area of contiguous artificial regions.

23. The computer-readable medium recited in claim 18 wherein defining comprises defining one or more physical dimensions of the at least one tunnel.

24. The computer-readable medium recited in claim 18 wherein defining comprises defining one or more integrated circuit layers of the at least one tunnel.

25. The computer-readable medium recited in claim 18 wherein the at least one tunnel is defined by one or more from the group consisting of a tunnel identifier, a tunnel style, a list of nets constrained by the at least one tunnel, and a list of tunnel segments.

26. A computer-readable medium having stored thereon at least one data structure comprising:
    a first block of data defining a set of constraints for global routing of a plurality of nets on an integrated circuit layout having a length and a width, the set of constraints comprising at least one tunnel to constrain at least one of the plurality of nets, the at least one tunnel having a length less than the integrated circuit layout length or width; and
    a second block of data defining global routing of the plurality of nets of the integrated circuit layout.

27. The computer-readable medium recited in claim 26, wherein the data structure further comprises:

a third block of data defining a set of Steiner trees that describe points of the plurality of nets of the integrated circuit.

28. An integrated circuit having a layout of a length and width, the layout being generated by a process which comprises:

defining a set of constraints for global routing of a plurality of nets on the integrated circuit layout, the set of constraints comprising at least one tunnel to constrain at least one of the plurality of nets, the at least one tunnel having a length less than the layout length or width; and performing global routing in accordance with the set of constraints.

29. The integrated circuit recited in claim 28 wherein the global routing is performed to couple at least two terminals with the at least one of the plurality of nets, and wherein the at least one tunnel extends substantially between the at least two terminals.

30. The integrated circuit recited in claim 29 wherein the at least one tunnel comprises an area of contiguous artificial regions.

\* \* \* \* \*